(12) United States Patent
Liu et al.

(10) Patent No.: US 12,472,722 B2
(45) Date of Patent: Nov. 18, 2025

(54) WINDABLE DISPLAY MODULE, AND DISPLAY DEVICE

(71) Applicant: KunShan Go-Visionox Opto-Electronics Co., Ltd, Jiangsu (CN)

(72) Inventors: Jia Liu, Jiangsu (CN); Liwei Ding, Jiangsu (CN); Fu Liao, Jiangsu (CN); Zheng Li, Jiangsu (CN); Xuebin Li, Jiangsu (CN)

(73) Assignee: Kunshan Go-Visionox Opto-Electronics Co., Ltd, Kunshan (CN)

( * ) Notice: Subject to any disclaimer, the term of this patent is extended or adjusted under 35 U.S.C. 154(b) by 311 days.

(21) Appl. No.: 18/299,879

(22) Filed: Apr. 13, 2023

(65) Prior Publication Data

US 2023/0249437 A1 Aug. 10, 2023

Related U.S. Application Data

(63) Continuation of application No. PCT/CN2021/134607, filed on Nov. 30, 2021.

(30) Foreign Application Priority Data

Jan. 20, 2021 (CN) .......................... 202110077084.9

(51) Int. Cl.
*B32B 7/12* (2006.01)
*H05K 5/02* (2006.01)

(52) U.S. Cl.
CPC ............. *B32B 7/12* (2013.01); *H05K 5/0217* (2013.01); *B32B 2255/26* (2013.01);
(Continued)

(58) Field of Classification Search
None
See application file for complete search history.

(56) References Cited

U.S. PATENT DOCUMENTS

| | | | |
|---|---|---|---|
| 2018/0102496 A1 | 4/2018 | Kim et al. | |
| 2019/0146557 A1 | 5/2019 | Choi et al. | |

(Continued)

FOREIGN PATENT DOCUMENTS

| | | | |
|---|---|---|---|
| CN | 106530973 A | 3/2017 | |
| CN | 108155218 A | 6/2018 | |

(Continued)

OTHER PUBLICATIONS

Machine Translation of CN 110164310.*
(Continued)

*Primary Examiner* — Laura C Powers
(74) *Attorney, Agent, or Firm* — Maier & Maier, PLLC

(57) ABSTRACT

A windable display module and a display device. The display module includes a plurality of film layers stacked together and at least one connecting layer group arranged between the plurality of film layers. In a stacking direction, the at least one connecting layer group is in contact with its adjacent film layer, so that a variable connecting force is generated between the film layers that are adjacent to the at least one connecting layer group. During a winding process or an unwinding process of the display module, a first connecting force is generated between the film layers that are adjacent to the at least one connecting layer group. During a displaying process of the display module, a second connecting force is generated between at least parts of the film layers that are in a displaying region. The first connecting force is less than the second connecting force.

20 Claims, 3 Drawing Sheets

(52) U.S. Cl.
CPC ..... *B32B 2307/202* (2013.01); *B32B 2307/42* (2013.01); *B32B 2307/7376* (2023.05); *B32B 2457/20* (2013.01)

(56) References Cited

U.S. PATENT DOCUMENTS

| | | | |
|---|---|---|---|
| 2019/0302851 | A1 | 10/2019 | In et al. |
| 2019/0361494 | A1 | 11/2019 | Wu et al. |
| 2020/0043383 | A1 | 2/2020 | Yang |

FOREIGN PATENT DOCUMENTS

| | | | |
|---|---|---|---|
| CN | 108898957 | A | 11/2018 |
| CN | 108986670 | A | 12/2018 |
| CN | 109360499 | A | 2/2019 |
| CN | 110164310 | A | 8/2019 |
| CN | 107910458 | B | 3/2020 |
| CN | 111816072 | A | 10/2020 |
| CN | 111833736 | A | 10/2020 |
| CN | 111862822 | A | 10/2020 |
| CN | 111862824 | A | 10/2020 |
| CN | 112150930 | A | 12/2020 |
| CN | 212256772 | U | 12/2020 |
| CN | 112164319 | A | 1/2021 |
| CN | 112908162 | A | 6/2021 |
| JP | 2020144383 | A | 9/2020 |
| KR | 1020200124163 | A | 11/2020 |

OTHER PUBLICATIONS

Machine Translation of CN 111833736.*
Office Action issued on Dec. 19, 2023, in corresponding Japanese Application No. 2023-535051, 14 pages.
International Search Report mailed Mar. 2, 2022, in International Application No. PCT/CN2021/134607, 15 pages.
Office Action issued on Mar. 15, 2022, in corresponding Chinese Application No. 202110077084.9, 17 pages.
Office Action issued on Sep. 22, 2025, in corresponding Korean Application No. 10-2023-7018349, 18 pages.

* cited by examiner

WINDABLE DISPLAY MODULE, AND DISPLAY DEVICE

CROSS REFERENCE TO RELATED APPLICATION

The present application is a continuation-application of International (PCT) Patent Application No. PCT/CN2021/134607 filed on Nov. 30, 2021, which claims foreign priorities of Chinese Patent Application No. 202110077084.9, filed on Jan. 20, 2021 in the National Intellectual Property Administration of China, the entire contents of which are hereby incorporated by reference in their entireties.

TECHNICAL FIELD

The present disclosure relates to the field of displaying technology, and more particular to a windable display module and a display device.

BACKGROUND

With the continuous improvement of the performance and the increase of the size of the flexible display module, the form of the flexible display module has also evolved from being foldable to being windable. The windable display module has become a developing trend of the future. How to reduce the damage to the display module during the winding or unwinding process has become a crucial issue.

SUMMARY

The present disclosure provides a windable display module and a display device, to reduce a probability of damage to the display module during a winding process or an unwinding process.

To solve the above-mentioned technical problem, one technical solution adopted by the present disclosure is a windable display module. The windable display module includes a plurality of film layers stacked together and at least one connecting layer group arranged between the plurality of film layers. The at least one connecting layer group contacts with at least two film layers of the plurality of film layers adjacent to the at least one connecting layer group along a stacking direction of the plurality of film layers, so that a variable connecting force is generated between the at least two film layers that are adjacent to the at least one connecting layer group. In response to the display module being in a winding process or an unwinding process, the connecting force generated between the at least two film layers that are adjacent to the at least one connecting layer group is a first connecting force. In response to the display module being in the displaying process, the connecting force generated between at least parts of the at least two film layers that are adjacent to the at least one connecting layer group and in a displaying region is a second connecting force. The first connecting force is less than the second connecting force.

The plurality of film layers further include two first film layers. The at least one connecting layer group is arranged between the two first film layers. Each of the at least one connecting layer group includes a pair of connecting layers that contact with each other. Each of the pair of connecting layers include a first surface and a second surface arranged oppositely to each other. The first surface of each connecting layer of the pair of connecting layers is fixedly connected to one of the two first film layer. The second surfaces of the pair of connecting layers contact with each other. The first connecting force or the second connecting force is generated between the second surfaces.

To solve the above-mentioned technical problem, another technical solution adopted by the present disclosure is a display device. The display device includes the display module according to any of the above-mentioned embodiments, a winding control mechanism and a connecting force control mechanism. The winding control mechanism is configured to drive the display module to perform a winding process or an unwinding process. The connecting force control mechanism is configured to, during the winding process or the unwinding process of the display module, control that the first connecting force is generated between the at least two film layers adjacent to the at least one connecting layer group. The connecting force control mechanism is also configured to, during the displaying process of the display module, control that a second connecting force is generated between at least parts of the at least two film layers that are in the displaying region and adjacent to the at least one connecting layer group.

The advantage of the present disclosure is: the windable display module provided in the present disclosure includes a plurality of film layers stacked together and at least one connecting layer group. The plurality of film layers include two first film layers. Each of the at least one connecting layer group includes a pair of connecting layers that contact with each other and are arranged between the two first film layers. Along the stacking direction, each connecting layer includes a first surface and a second surface arranged oppositely to each other. The first surface of each of the pair of connecting layers is fixedly connected to one of the first film layers. The second surfaces of the pair of connecting layers contact with each other, and a variable connecting force is generated between them. For example, when the display module is in a winding process or an unwinding process, a relatively low first connecting force is generated between the two second surfaces. By means of this design approach, during the winding or unwinding process, the tensile stress generated between the individual film layers may be reduced, and the probability of damage to each film layer during the winding or unwinding process may be reduced. When the display module is operating in the displaying process, a greater second connecting force is generated between at least parts of the second surfaces in the displaying region. This design approach may ensure that, during a normal displaying process, at least the individual film layers of the display module that are in the displaying region are closely attached to each other, and the displaying effect is ensured.

DETAILED DESCRIPTION

Technical solutions in embodiments of the present disclosure will be described clearly and thoroughly in connection with accompanying drawings of the embodiments of the present disclosure. Obviously, the described embodiments are only a part of the embodiments, but not all of them. All other embodiments occur to a person of ordinary skills in the art based on embodiments of the present disclosure without creative efforts should all be within the protection scope of the present disclosure.

Figure 1:
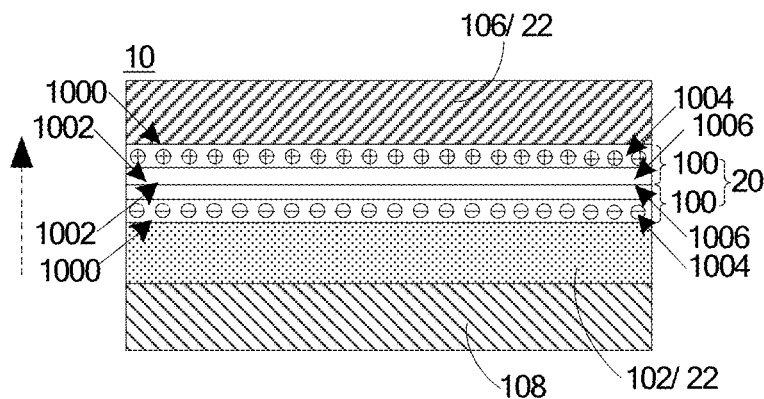
FIG. 1 is a schematic structural diagram of a windable display module according to an embodiment of the present disclosure.

As shown in FIG. 1, the windable display module 10 according to an embodiment of the present disclosure includes a plurality of film layers that are laminated or stacked together. The windable display module 10 further includes at least one connecting layer group 20 arranged between the plurality of film layers. The connecting layer 100 includes a first surface 1000 and a second surface 1002. The first surface 1000 is provided opposite to the second surface 1002 along the stacking direction. The stacking direction is indicated by a dotted-line arrow as shown in FIG. 1. The first surface 1000 is fixedly connected to an adjacent film layer. In some embodiments, the fixed connection between the first surface 1000 and its adjacent film layer may be achieved by adhesive agent or by means of directly forming the adjacent film layer on the first surface 1000.

When the display module 10 is either in a winding state or an unwinding state, the above-mentioned first surface 1000 and its adjacent film layer are tightly fitted or attached to each other. A connecting force generated or formed between the first surface 1000 and its adjacent film layer remains stable. A connecting force between the second surface 1002 and its adjacent film layer is variable. The connecting force is configured to connect the second surface 1002 and its adjacent film layer together. In some embodiments, when the display module 10 is in the winding or unwinding process, a first connecting force is generated or is formed between the second surface 1002 and its adjacent film layer. In this way, during the winding or unwinding process of the display module 10, a tensile stress provided between each of the film layers is reduced, thereby reducing a probability of damage to each of the film layers during the winding or unwinding process.

While the display module 10 is in the displaying process, a second connecting force is generated or is formed between at least a part of the second surface 1002 of the connecting layer 100 in the displaying region and its adjacent film layer. This kind of design may ensure that, each film layer of the display module 10 is attached tightly to each other during a normal displaying process, and the displaying effect is guaranteed. In some embodiments, when the display module 10 is in the displaying process, the second connecting force may be only generated between a part of the second surface 1002 of the connecting layer 100 that is in the displaying region and its adjacent film layer, while the first connecting force is still generated between other parts of the second surface 1002 of the connecting layer 100 in the non-displaying region and its adjacent film layer. In some embodiments, when the display module 10 is in the displaying process, the second connecting force may be generated between parts of the second surface 1002 of the connecting layer 100 in the displaying region and its adjacent film layer, and between the second surface 1002 of the connecting layer 100 in the non-displaying region and its adjacent film layer.

In some embodiments, as further shown in FIG. 1, the display module 10 includes a plurality of film layers that are laminated or stacked together. The plurality of film layers include two first film layers 22 and at least one connecting layer group 20. Each of the at least one connecting layer group 20 includes a pair of connecting layers 100. One of the pair of connecting layers 100 contacts with the other one of the pair of connecting layers 100. The pair of connecting layers 100 are arranged between the two first film layers 22. Each connecting layer 100 includes a first surface 1000 and a second surface 1002. The first surface 1000 and the second surface 1002 are provided oppositely to each other along a stacking direction of the plurality of film layers. The first surface 1000 of each of the pair of connecting layers 100 is fixedly connected to one of the first film layers 22. The two second surfaces 1002 of the pair of connecting layers 100 contact with each other, and a variable connecting force is generated between the two second surfaces 1002. The variable connecting force is configured to connect the two second surfaces 1002 together. In other words, the two first surfaces 1000 of the two connecting layers 100 in the connecting layer group are arranged away from each other. The first surface 1000 of each of the two connecting layers 100 is fixedly connected to its adjacent first film layer 22. The two second surfaces 1002 of the two connecting layers 100 in the connecting layer group 20 are arranged to be close to each other and in contact with each other. The connection force between the two second surfaces 1002 contacting with each other may be varied. When the display module 10 is in the winding or unwinding process, a relatively lower first connection force is generated or is formed between the two second surfaces 1002 of the same connecting layer group 20. By means of this design approach, during the winding or unwinding process, the tensile stress occurred between the individual film layers may be reduced, and the probability of damage to each film layer during the winding or unwinding process may be reduced. When the display module 10 is operating in the displaying process, a greater second connecting force is generated between at least parts of the second surfaces 1002 in the displaying region. This design approach may ensure that, during a normal displaying process, at least parts of the individual film layers of the display module 10 that are in the displaying region are closely attached to each other, and the display effect is guaranteed.

In some embodiments, the magnitude of the above-mentioned first connecting force is 0. By means of this design approach, during the winding and unwinding process of the display module 10, the second surface 1002 of the connecting layer 100 in the display module 10 and its adjacent film layer are separated from each other, and the tensile stress is generated between the individual film layers may be minimized. Further, in the present embodiment, the specific value of the above-mentioned second connecting force that are greater than the first connecting force is not limited, as long as the second surface 1002 of the connecting layer 100 and its adjacent film layer are tightly fitted or adhered to each other.

In some embodiments, the connecting layer 100 includes a conductive film layer 1004. The pair of connecting layers 100 of the connecting layer group 20 include two conductive film layers 1004. When being connected to electricity or under power condition, one of the two conductive film layers 1004 carries a plurality of positive electrical charges, the other one of the two conductive film layers 1004 carries a plurality of negative electrical charges. The two conductive film layers 1004 under power condition are attracted to each other since they carry two different kinds of electrical charges, and a second connecting force is generated or is formed between the two conductive film layers 1004. In this way, the two first film layers 22 respectively connected to the pair of connecting layers 100 are tightly attached to each other. In addition, the two conductive film layers 1004 in the connecting layer group 20 don't carry electrical charges in the off-power state, such that the two connecting layers 100 of the connecting layer group 20 are separated from each other, and a first connecting force is generated or is formed between them. In some embodiments, the conductive film layer 1004 may be a metal film, an oxide film, a polymer film, a composite film etc. (e.g., a TiAlTi composite film, an Indium Tin Oxide ITO, etc.). The arrangement manner of the above-mentioned connecting layer 100 has a relatively simpler structure, and the variable connecting force may be achieved more easily.

Further, in order to reduce the probability of breakage or fracture of the conductive film layer 1004 during the winding process or the unwinding process, as shown in FIG. 1, the connecting layer 100 may also include a cushioning film layer 1006 or a buffer film layer 1006. The buffer film layer 1006 is stacked with the conductive film layer 1004. In this case, one surface of the buffer film layer 1006 that is away from the conductive film layer 1004 is the second surface 1002, and a surface of the conductive film layer 1004 that is away from the buffer film layer 1006 is the first surface 1000. In addition, the two buffer film layers 1006 of the pair of connecting layers 100 in the above-mentioned connecting layer group 20 are in contact with each other. There is no any fixed connecting member between two oppositely arranged surfaces (namely, the second surfaces 1002) of the two buffer film layers 1006. The friction force between the two surfaces which are face to face and respectively belong to the two buffer film layers 1006 is less than a threshold. With the introduction of the above-mentioned buffer film layers 1006, during the winding process and the unwinding process of the display module 10, the frictional stress generated between the individual film layers may be reduced, the surface abrasion or the surface wear may be reduced, and the displaying effect may be guaranteed. In some embodiments, the above-mentioned buffer film layers 1006 may be formed on surfaces of the conductive film layers 1004 by way of coating, etc. The buffer film layer 1006 may choose some kinds of materials with better insulation performances, smooth surfaces, low friction coefficient and better wear resistance. For example, the material may be organic, e.g., PTFE, modified nylon, polyethylene, etc.

In addition, in order to ensure absorption capacity and buffering effect of the conductive film layer 1004 when being under power condition, the thickness of each of the above-mentioned connecting layers 100 is greater than or equal to 20 microns, for example, 30 microns, 40 microns, etc. Both the conductive film layer 1004 and the buffer film layer 1006 have a thickness greater than or equal to 10 microns, for example, 15 microns, 20 microns, etc.

Of course, in some embodiments, the structural design of the connecting layer 100 may be different. For example, the above-mentioned connecting layer 100 may include an adhesive member. The adhesion of the adhesive member varies with temperature. The adhesive member may include at least one selected from the group consisting of an epoxy resin glue, a polyurethane glue, and a pressure-sensitive glue. The adhesion of the adhesive member made of the above-mentioned materials may vary significantly with temperature.

Further, in some embodiments, the above-mentioned connecting layer 100 may include a thermal expansion member with absorbing capability. A spacing between the thermal expansion members of the two connecting layers 100 may be varied. In this way, the thermal expansion members may contact with (corresponding to the second connecting force) or be separated from (corresponding to the first connecting force) each other. Taking a negative thermal expansion member as an example, the negative thermal expansion member may also be formed by an elastic body and negative thermal expansion material doped in the elastic body. The doped negative thermal expansion material may have a shape of a granule, a strip, etc. The elastic body may be an elastomer that is easily deformable and may have absorbing capability, etc. The negative thermal expansion material may be made from at least one selected from the group consisting of the lanthanide iron-silica $La(Fe,Si)_{13}$ compound, the anti-perovskite compound $Mn_3AN$ (A=Zn, Ga, Cu), zirconium tungsten octaoxide $ZrW2O8$ and hafnium tungsten octaoxide $HfW_2O_8$.

Figure 2:
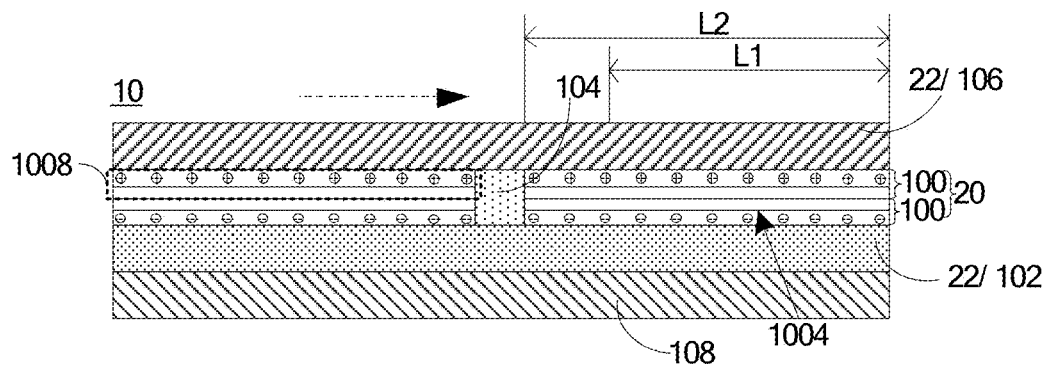
FIG. 2 is a schematic structural diagram of a windable display module according to another embodiment of the present disclosure.

In some embodiments, as shown in FIG. 2, FIG. 2 is a schematic structural diagram of a windable display module according to another embodiment of the present disclosure. The connecting layer 100 includes at least one partition region for partitioning or separating the connecting layer 100. The partition region is filled with an adhesive layer 104. The two first film layers 22 are fixedly connected to each other along the stacking direction by the adhesive layer 104. In some embodiments, the length of the display module 10 is relatively greater. During the winding and unwinding process of the display module 10 having a greater length, in order to reduce probability of misalignment or wrinkling between the film layers between which the first connecting force is formed, the above-mentioned adhesive layer 104 is introduced.

In some embodiments, as shown in FIG. 2, the connecting layer 100 includes a plurality of connecting sub-layers 1008 that are spaced apart or arranged at intervals along an unwinding direction of the display module 10. The unwinding direction is illustrated by the dotted line arrow of FIG. 2. An adhesive layer 104 is provided between adjacent connecting sub-layers 1008. That is, the width of the partition region is the same as the width of the connecting layer 100 along a direction perpendicular to the unwinding direction. The connection layer 100 is partitioned or separated into a plurality of independent connecting sub-layers 1008 by the partition regions. On the one hand, during the winding process or the unwinding process of the display module 10, this design approach may reduce the probability of misalignment or wrinkling between the film layers corresponding to the first connecting force. On the other hand, this design approach may allow each connecting sub-layer 1008 to be individually connected to the connecting force control mechanism via corresponding circuitry subsequently. In this way, the state of the connecting force of each connecting sub-layer 1008 may be controlled separately, and a higher degree of flexibility may be achieved.

Further, in the unwinding direction of the display module 10, the size (i.e., length) of the connecting sub-layer 1008 is greater than or equal to ten times a size (i.e., length) of the adhesive layer 104. For example, the length of the connecting sub-layer 1008 is 15 times, 20 times, etc. the length of the adhesive layer 104. In the above-mentioned design approach, the length of the connecting sub-layer 1008 is much greater than the length of the adhesive layer 104, the display module 10 may be designed as a form similar to a roll of paper. This design approach may greatly reduce the tensile stress generated between the individual layers. At the same time, during the winding process or the unwinding process of the display module 10, this design approach further reduces the probability of misalignment or wrinkling between the film layers between which the first connecting force is generated.

Of course, in some embodiments, the width of the partition region may also be less than the width of the connecting layer 100 along the direction perpendicular to the unwinding direction. The connecting layer 100 is a single integral piece.

As is further shown in FIG. 2, the film layers of the display module 10 provided in the present disclosure may include a polarization layer 106, a display layer 102, and a supporting layer 108 that are stacked together. In order to reduce the thickness of the display module 10, the polarization layer 106 may be a cover plate with polarization function. The display layer 102 may include a light emitting layer, an array layer, and a supporting film that are stacked together. The light emitting layer is arranged to be closer to the polarization layer 106 than the array layer. The supporting film may be configured to reduce the probability of warping or buckling of both the light emitting layer and the array layer themselves. The supporting layer 108 may be a steel sheet and the like. The supporting layer 108 is configured to support the display layer 102, and reduces the probability of wear or abrasion of the display layer 102.

As shown in FIG. 1 or FIG. 2, the above-mentioned at least one connecting layer group 20 includes one connecting layer group 20. One of the above-mentioned two first film layers 22 is the polarization layer 106, the other one of the above-mentioned two first film layers 22 is the display layer 102. The connecting layer group 20 is arranged between the polarization layer 106 and the display layer 102. When the arranging manner of the conductive film layer 1004 is adopted by the structure of the connecting layer 100, as shown in FIG. 2, a connecting layer group is provided between the display layer 102 and the polarization layer 106. The connecting layer group 20 is formed by two connecting layers 100. The conductive film layer 1004 of one of the two connecting layers 100 of the connecting layer group 20 is fixedly connected to the display layer 102. The conductive film layer 1004 of the other one of the two connecting layers 100 of the connecting layer group 20 is fixedly connected to the polarization layer 106. When the structure of the connecting layer 100 adopts the thermal expansion member or the adhesive member having variable adhesion, two connecting layers 100 are provided between the polarization layer 106 and the display layer 102. One side surface of one of the two connecting layers 100 may be fixedly connected to the polarization layer 106, one side surface of the other one of the two connecting layers 100 may be fixedly connected to the display layer 102. A variable connecting force is generated between the surfaces of the two connecting layers 100 that are arranged oppositely to or facing each other. In some embodiments, when the structure of the connecting layer 100 adopts a thermal expansion member or an adhesive member with variable adhesion, only one connecting layer 100 may be arranged between the polarization layer 106 and the display layer 102. One side surface of the connecting layer 100 may be fixedly connected to one of the polarization layers 106 and the display layer 102. A variable connecting force is generated between the other side surface of the connecting layer 100 and the other one of the polarization layers 106 and the display layer 102.

Figure 3:
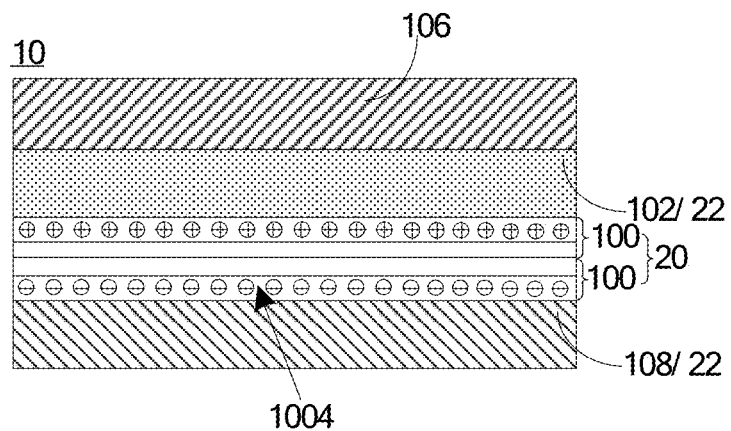
FIG. 3 is a schematic structural diagram of a windable display module according to another embodiment of the present disclosure.

In some embodiments, as shown in FIG. 3, the above-mentioned at least one connecting layer group 20 includes one connecting layer group 20. The above-mentioned two first film layers 22 include the display layer 102 and the supporting layer 108. The connecting layer group 20 is arranged between the display layer 102 and the supporting layer 108. When the arranging manner of the conductive film layer 1004 is adopted by the structure of the connecting layer 100, as shown in FIG. 3, the connecting layer group 20 is provided between the display layer 102 and the supporting layer 108. The connecting layer group 20 is formed by two connecting layers 100. The conductive film layer 1004 of one of the two connecting layers 100 of the connecting layer group 20 is fixedly connected to the display layer 102. The conductive film layer 1004 of the other one of the two connecting layers 100 of the connecting layer group 20 is fixedly connected to the supporting layer 108.

Figure 4:
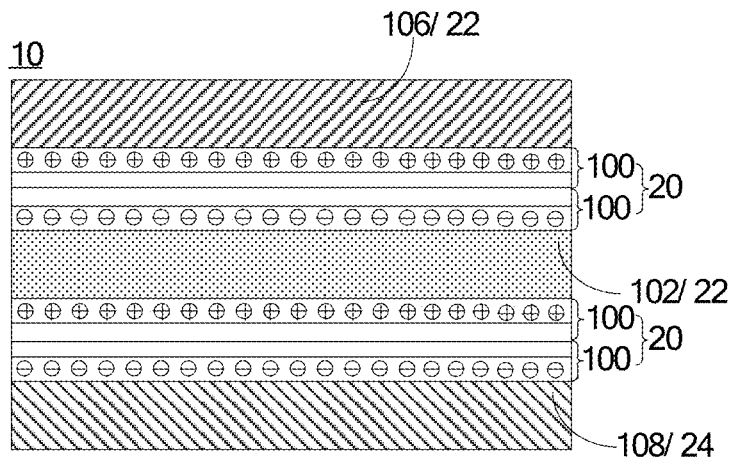
FIG. 4 is a schematic structural diagram of a windable display module according to another embodiment of the present disclosure.

In some embodiments, as shown in FIG. 4, the above-mentioned at least one connecting layer group 20 includes two connecting layer groups 20. The plurality of film layers which are above-mentioned further include a second film layer 24 that are stacked together with the two first film layers 22. One of the above-mentioned two first film layers 22 is the polarization layer 106, the other one of the above-mentioned two first film layers 22 is the display layer 102, and the second film layer 24 is the supporting layer 108. The polarization layer 106, the display layer 102, and the supporting layer 108 are successively stacked or laminated together. Each of the two connecting layer groups 20 is arranged between two layers of the polarization layer 106, the display layer 102, and the supporting layer 108. That is, one connecting layer group 20 is arranged between the polarization layer 106 and the display layer 102. The other connecting layer group 20 is arranged between the display layer 102 and the supporting layer 108. In order not to affect the displaying effect, the connecting layer 100 that is arranged on a light emitting side of the display layer 102 of the display module 10 (e.g., the connection layer 100 that is arranged between the polarization layer 106 and the display layer 102) is made of a material with a greater light transmission (for example, a transparent indium tin oxide film). The connecting layer 100 that is arranged on the non-light emitting side of the display layer 102 (e.g., the connecting layer that is arranged between the display layer 102 and the supporting layer 108) may be made of a material with a greater or a lower light transmission.

In addition, in order to reduce difficulty of a preparation process, as shown in FIG. 2, each of the above-mentioned polarization layer 106, the display layer 102 and the supporting layer 108 is designed to be a whole layer. That is, the partition region of the connecting layer 100 does not extend into the polarization layer 106, the display layer 102, and the supporting layer 108 at corresponding locations.

Figure 5:
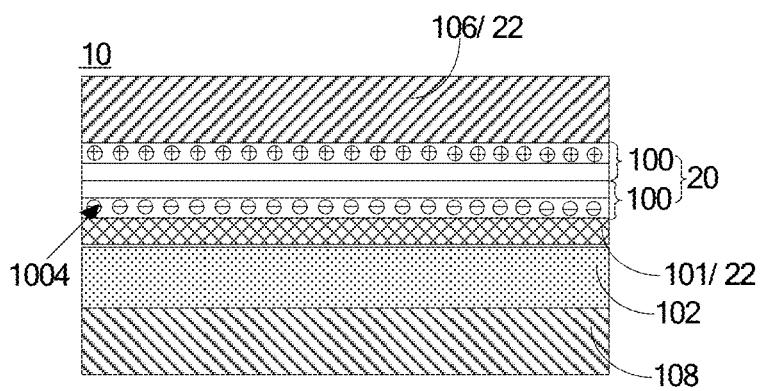
FIG. 5 is a schematic structural diagram of a windable display module according to another embodiment of the present disclosure.

Further as shown in FIG. 5, the at least one connecting layer group 20 includes one connecting layer group. The two first film layers 22 include the polarization layer 106 and the interlayer insulation layer 101. The plurality of film layers further include the display layer 102. The display layer 102 is arranged on one side of the interlayer insulation layer 101 away from the polarization layer 106. Each of the pair of connecting layers 100 includes one conductive film layer 1004. The interlayer insulation layer 101 is arranged between the display layer 102 and its adjacent conductive film layer 1004. That is, one connecting layer group 20 is arranged between the polarization layer 106 and the interlayer insulation layer 101. There is no direct contact between the display layer 102 and its adjacent conductive film layer

1004. The introduction of the above-mentioned interlayer insulation layer 101 may reduce generating probability of static electricity. In some embodiments, the material of the interlayer insulation layer 101 may be inorganic matter or organic matter.

Figure 6:
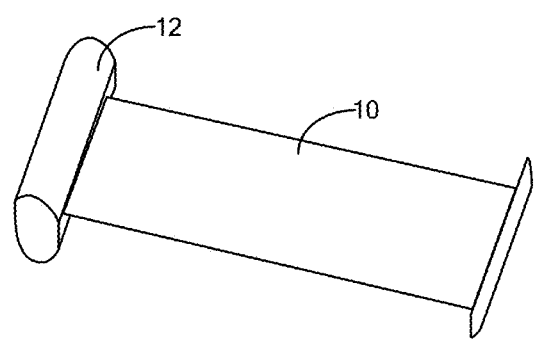
FIG. 6 is a schematic structural diagram of a display device according to an embodiment of the present disclosure.
Figure 7:
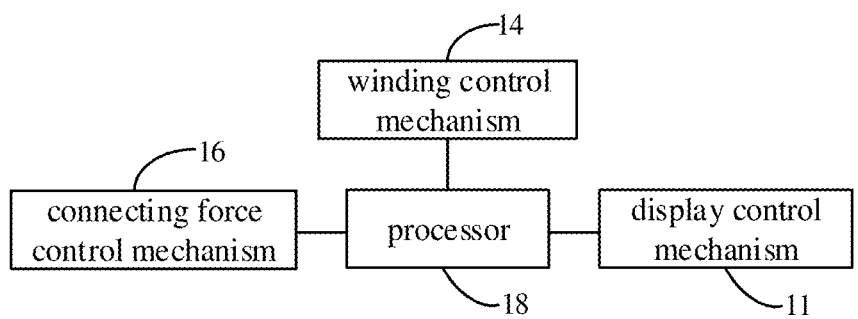
FIG. 7 is a schematic structural frame diagram of an implementation within a housing of FIG. 6.

As shown in FIG. 6 to FIG. 7, the display device generally includes a housing 12. The housing 12 is configured to accommodate or house the display module 10 mentioned in any of the above embodiments. Further, a winding control mechanism 14 and a connecting force control mechanism 16 is also housed inside the housing 12.

The winding control mechanism 14 is configured to drive the display module 10 to perform the winding process or the unwinding process. The winding control mechanism 14 may include a motor. The output end of the motor may be connected to an end of the display module 10. By controlling a rotating rate of the output end of the motor, a rate of winding or unwinding of the display module 10 may be controlled. By controlling a rotating direction of the output end of the motor, the display module 10 may be controlled to perform the winding process or the unwinding process. For example, the display module 10 winds when the output end of the motor rotates clockwise, and the display module 10 unwinds when the output end of the motor rotates counterclockwise, and vice versa.

When the display module 10 is in the winding process or in the unwinding process, the connecting force control mechanism 16 is configured to control that, the first connecting force is generated between the second surfaces 1002 of the connecting layers 100. When the display module 10 is in the displaying process, the connecting force control mechanism 16 is configured to control that, the second connecting force is generated between at least the parts of the second surfaces 1002 in the displaying region. For example, when the structure of the connecting layer 100 adopts the arrangement manner of the conductive film layer 1004, the connecting force control mechanism 16 may be an electrical charge generating apparatus. The electrical charge generating apparatus may be connected to each of the two conductive film layers 1004 of the connecting layer group 20. During the displaying process, the electrical charge generating apparatus is configured to control that, at least a part of one of the two conductive film layers 1004 that is in the displaying region includes a plurality of positive electrical charges, and at least a part of the other one of the two conductive film layers 1004 that is in the displaying region includes a plurality of negative electrical charges. In this way, the two connecting layers 100 of the connecting layer group 20 are tightly attached or fitted to each other. For another example, when the structure of the connecting layer 100 includes the thermal expansion member or the adhesive member, the connecting force control mechanism 16 may be a heating apparatus. The heating apparatus controls a temperature of the thermal expansion member or the adhesive member.

In order to enhance the operating efficiency and automation degree of the display device, the display device provided by some embodiments of the present disclosure may also include a processor 18. The processor 18 may be housed inside the housing 12, and may be coupled to the winding control mechanism 14 and the connecting force control mechanism 16. The process 18 is configured to send a winding instruction or an unwinding instruction to the winding control mechanism 14, and to send a first connecting force controlling instruction to the connecting force control mechanism 16. After receiving an instruction fed by the winding control mechanism 14 and indicating that the unwinding process is finished, the processor 18 is configured to send a second connecting force controlling instruction to the connecting force control mechanism 16.

In some situations, when being unwounded, the display module 10 is not fully unfolded. That is, the effective display area of the display module 10 is not 100%. This is for reducing power consumption of the entire display device. As shown in FIG. 2, along the unwinding direction of the display module 10, the connecting layer 100 includes a plurality of connecting sub-layers 1008 that are spaced apart from each other. Each connecting sub-layer 1008 is electrically connected to the connecting force control mechanism 16. The connecting force control mechanism 16 is configured to control that, a second connecting force is generated or is formed between a connecting sub-layer 1008 including the present displaying region and its adjacent film layer. For example, as shown in FIG. 2, a length of the present displaying region is L1, thus it can be controlled that, a second connecting force is generated or is formed between the connecting sub-layer 1008 covering the present displaying region and its adjacent film layer. At this time, a length L2 of the connecting sub-layer 1008 corresponding to the second connecting force is greater than or equal to L1. For the other remaining connecting sub-layers 1008, the connecting force control mechanism 16 may control them to have the first connecting force.

In addition, in order to further reducing the power consumption of the entire display device, the display device may further include a display control mechanism 11. The display control mechanism 11 is coupled to the processor 18. After the unwinding process of the display module 10 is finished, the display control mechanism 11 is configured to detect and obtain a current actual displaying region of the display module 10. The display control mechanism 11 sends the actual display region to the processor 18, such that a screen or a picture is controlled by the processor 18 to be displayed on the present actual display region, while other non-actual display regions do not display a screen.

In a specific application scenario, the workflow of the above-mentioned display device may be: in response to receiving, by the processor 18, an unwinding process trigger instruction, the processor 18 sends the unwinding instruction to the winding control mechanism 14, and sends the first connecting force controlling instruction to the connecting force control mechanism 16, such that the winding control mechanism 14 drives the display module 10 to unwind, and the connecting force control mechanism 16 controls the second surfaces 1002 of two connecting layers 100 of the same connecting layer group 20 of the display module 10 to be separated from each other; in response to receiving, by the processor 18, an instruction indicating that the unwinding process is finished, the processor 18 sends the second connecting force controlling instruction to the connecting force control mechanism 16, such that the connecting force control mechanism 16 controls at least parts of the second surfaces 1002 of two connecting layers 100 in a same connecting layer group 20 of the display module 10 that are in the displaying region to be tightly attached to each other, the screen or the picture is controlled by the processor 18 to be displayed on the current displaying region; in response to receiving, by the processor 18, the winding process trigger instruction, the processor 18 controls the displaying of the screen or the picture on the current displaying region to be stopped, sends the winding instruction to the winding control mechanism 14, and sends the first connecting force controlling instruction to the connecting force control mechanism 16, such that the winding control mechanism 14 drives the display module 10 to wind, and the connecting force control mechanism 16 controls the second surfaces 1002 of two connecting layers 100 of a same connecting layer group 20 of the display module 10 to be separated from each other.

The above are only implementations of the present disclosure, and do not limit the patent scope of the present disclosure. Any equivalent changes to the structure or processes made by the description and drawings of this application or directly or indirectly used in other related technical field are included in the protection scope of this application.

What is claimed is:

1. A windable display module, comprising:
   a plurality of film layers stacked together, and
   at least one connecting layer group arranged between the plurality of film layers along a stacking direction,
   the plurality of film layers comprises two first film layers, the at least one connecting layer group is arranged between the two first film layers, each layer group of the at least one connecting layer group comprises a pair of connecting layers that contact with each other, each layer of the pair of connecting layers comprises a first surface and a second surface arranged oppositely to each other, the first surface of each connecting layer of the pair of connecting layers is fixedly connected to one of the two first film layers;
   at least one partition region, wherein the at least one partition region is configured to partition the connecting layer; and
   an adhesive layer filled in the partition region, wherein the adhesive layer is configured to fixedly connect the two first film layers with each other along the stacking direction.

2. The display module as claimed in claim 1, wherein the pair of connecting layers comprises two conductive film layers, in response to the two conductive film layers being under power condition, one of the two conductive film layers carries a plurality of positive electrical charges, the other one of the two conductive film layers carries a plurality of negative electrical charges, the two conductive film layers under power condition carry two different kinds of electrical charges.

3. The display module as claimed in claim 2, wherein the connecting layer further comprises a buffer film layer stacked with the conductive film layer, the second surface is a surface of the buffer film layer that is away from the conductive film layer, the two buffer film layers of the pair of connecting layers contact with each other.

4. The display module as claimed in claim 1, wherein the connecting layer comprises an adhesive member, and an adhesion of the adhesive member varies with temperature.

5. The display module as claimed in claim 1, wherein along an unwinding direction of the display module, the connecting layer comprises a plurality of connecting sub-layers that are spaced apart from each other, and the adhesive layer is arranged between adjacent connecting sub-layers.

6. The display module as claimed in claim 5, wherein along the unwinding direction of the display module, a size of the connecting sub-layer is greater than or equal to ten times a size of the adhesive layer.

7. The display module as claimed in claim 1, wherein the at least one connecting layer group comprises one connecting layer group, the two first film layers comprise a polarization layer and a display layer, and the connecting layer group is arranged between the polarization layer and the display layer; or the two first film layers comprise a display layer and a supporting layer, and the connecting layer group is arranged between the display layer and the supporting layer.

8. The display module as claimed in claim 1, wherein the at least one connecting layer group comprises one connecting layer group, the two first film layers comprise a polarization layer and an interlayer insulation layer, the plurality of film layers further comprise a display layer, the display layer is arranged at one side of the interlayer insulation layer away from the polarization layer, the pair of connecting layers comprise a conductive film layer respectively, and the interlayer insulation layer is arranged between the display layer and the conductive film layer adjacent to the display layer.

9. The display module as claimed in claim 1, wherein the at least one connecting layer group comprises two connecting layer groups, the plurality of film layers further comprise a second film layer stacked with the two first film layers, the two first film layers and the second film layer are a polarization layer, a display layer and a supporting layer respectively; the polarization layer, the display layer and the supporting layer are stacked successively, one of the two connecting layer groups is arranged between the polarization layer and the display layer, and the other one of the two connecting layer groups is arranged between the display layer and the supporting layer.

10. The display module as claimed in claim 1, wherein a thickness of the connecting layer is greater than or equal to 20 micrometers.

11. A display device, comprising:
    the windable display module as claimed in claim 1;
    a winding control mechanism, configured to drive the display module to perform a winding process or an unwinding process; and
    a connecting force control mechanism, along an unwinding direction of the display module, the connecting layer comprises a plurality of connecting sub-layers that are spaced apart from each other, each of the connecting sub-layers is electrically connected to the connecting force control mechanism.

12. The display device as claimed in claim 11, wherein the second surfaces of the pair of connecting layers contact with each other.

13. The display device as claimed in claim 12, further comprising:
    a processor, coupled to the winding control mechanism and the connecting force control mechanism, wherein the processor is configured to send a winding instruction or an unwinding instruction to the winding control mechanism, and to send a first connecting force controlling instruction to the connecting force control mechanism;
    the processor is also configured to, in response to receiving an instruction fed by the winding control mechanism and indicating that the unwinding process being finished, send a second connecting force controlling instruction to the connecting force control mechanism.

14. The display device as claimed in claim 12, wherein the connecting layer comprises a conductive film layer, the connecting force control mechanism comprises an electrical charge generating apparatus.

15. The display device as claimed in claim 12, wherein the connecting layer comprises an adhesive member or a thermal expansion member, the connecting force control mechanism comprises a heating apparatus.

16. The display device as claimed in claim 1, wherein the connecting layer comprises a negative thermal expansion member, the negative thermal expansion member be formed by an elastic body and negative thermal expansion material doped in the elastic body, the negative thermal expansion material is made from at least one selected from the group consisting of the lanthanide iron-silica $La(Fe,Si)_{13}$ compound, the anti-perovskite compound $Mn_3AN$ (A=Zn, Ga, Cu), zirconium tungsten octaoxide $ZrW_2O_8$ and hafnium tungsten octaoxide $HfW_2O_8$.

17. The display device as claimed in claim 1, wherein the width of the partition region is the same as the width of the connecting layer along a direction perpendicular to the unwinding direction and the connecting layer is partitioned or separated into a plurality of independent connecting sub-layers by the partition regions.

18. The display device as claimed in claim 3, wherein material of the buffer film layer is PTFE or modified nylon or polyethylene.

19. The display device as claimed in claim 3, wherein both the conductive film layer and the buffer film layer have a thickness greater than or equal to 10 microns.

20. A windable display module, comprising:
   a plurality of film layers stacked together and at least one connecting layer group arranged between the plurality of film layers, wherein the at least one connecting layer group contacts with at least two film layers of the plurality of film layers adjacent to the at least one connecting layer group along a stacking direction of the plurality of film layers;
   wherein the plurality of film layers comprise two first film layers, the at least one connecting layer group is arranged between the two first film layers, each of the at least one connecting layer group comprises a pair of connecting layers that contact with each other, each of the pair of connecting layers comprises a first surface and a second surface arranged oppositely to each other, the first surface of each connecting layer of the pair of connecting layers is fixedly connected to one of the two first film layers;
   the connecting layer comprises a negative thermal expansion member, the negative thermal expansion member be formed by an elastic body and negative thermal expansion material doped in the elastic body, the negative thermal expansion material is made from at least one selected from the group consisting of the lanthanide iron-silica $La(Fe,Si)_{13}$ compound, the anti-perovskite compound $Mn_3AN$ (A=Zn, Ga, Cu), zirconium tungsten octaoxide $ZrW_2O_8$ and hafnium tungsten octaoxide $HfW_2O_8$.

* * * * *